(12) United States Patent
von Ammon et al.

(10) Patent No.: US 7,387,676 B2
(45) Date of Patent: Jun. 17, 2008

(54) PROCESS FOR PRODUCING SILICON SEMICONDUCTOR WAFERS WITH DEFINED DEFECT PROPERTIES, AND SILICON SEMICONDUCTOR WAFERS HAVING THESE DEFECT PROPERTIES

(75) Inventors: Wilfried von Ammon, Hocburg (AT); Walter Haeckl, Zeilarn (DE); Andreas Huber, Garching (DE); Ulrich Lambert, Emmerting (DE)

(73) Assignee: Siltronic AG, Munich (DE)

( * ) Notice: Subject to any disclaimer, the term of this patent is extended or adjusted under 35 U.S.C. 154(b) by 3 days.

(21) Appl. No.: 11/452,870

(22) Filed: Jun. 14, 2006

(65) Prior Publication Data

US 2006/0283374 A1    Dec. 21, 2006

(30) Foreign Application Priority Data

Jun. 17, 2005    (DE) ................. 10 2005 028 202

(51) Int. Cl.
*C30B 15/00* (2006.01)
(52) U.S. Cl. .................. 117/13; 117/932; 438/478; 438/795
(58) Field of Classification Search ............. 117/1; 257/1; 438/1
See application file for complete search history.

(56) References Cited

U.S. PATENT DOCUMENTS

| 5,487,354 A | 1/1996 | von Ammon et al. |
| 6,045,610 A | 4/2000 | Park et al. |

| 2004/0192015 A1* | 9/2004 | Ammon et al. ............. 438/502 |

FOREIGN PATENT DOCUMENTS

| DE | 44 14 947 A1 | 8/1985 |
| DE | 198 06 045 A1 | 8/1998 |
| DE | 699 08 965 T2 | 6/2003 |
| EP | 1 125 008 B1 | 6/2003 |
| WO | WO 02/066714 A2 | 8/2002 |

OTHER PUBLICATIONS

Ji Wook Seo and Young Kwan Kim, The Annihilation of the Flow Pattern Defects in Czochralski Silicon Crystal by High Temperature Heat Treatment, Journal of The Electrochemical Society, 149 (7) G379-G383 (2002).

(Continued)

*Primary Examiner*—Yogendra N. Gupta
*Assistant Examiner*—Marissa W. Chaet
(74) *Attorney, Agent, or Firm*—Brooks Kushman P.C.

(57) ABSTRACT

In a process for producing silicon semiconductor wafers, a silicon single crystal is pulled using the Czochralski method and is processed to form semiconductor wafers, a ratio V/G of pulling rate V and axial temperature gradient G at a growth front during the pulling of the single crystal being controlled in such a manner that agglomerated vacancy defects above a critical size are formed in the single crystal, the agglomerated vacancy defects, in a region of the semiconductor wafer that is of relevance to electronic components, shrinking during production of the components such that the size in this region no longer exceeds the critical size. Silicon semiconductor wafers with agglomerated vacancy defects in the relevant device region preferably contain agglomerated vacancy defects having an inner surface which is at least partially free of an oxide layer and a size of less than 50 nm.

13 Claims, 8 Drawing Sheets

OTHER PUBLICATIONS

Kikuo Yamabe et al, Thickness Dependence of Dielectric Breakdown Failure of Thermal SiO2 Films, Proc. Int. Reliability Phys. Symp. (IEEE,NY), 1983, p. 184-194.

Voronkov et al, Vacancy-type microdefect formation in Czochralski silicon, Journal Of Crystal Growth 194 (1998) 76-88.

Voronkov et al, Vacancy and self-interstitial concentration inocrporated into growing silicon crystals, Journal Of Applied Physics, vol. 86, No. 11, 1999, p. 5975 to 5982.

* cited by examiner

Fig. 1  No sacrificial oxide

Fig. 2    Sacrificial oxide with a thickness of 200 nm

Fig. 3  Sacrificial oxide with a thickness of 400 nm

Fig. 4  Sacrificial oxide with a thickness of 800 nm

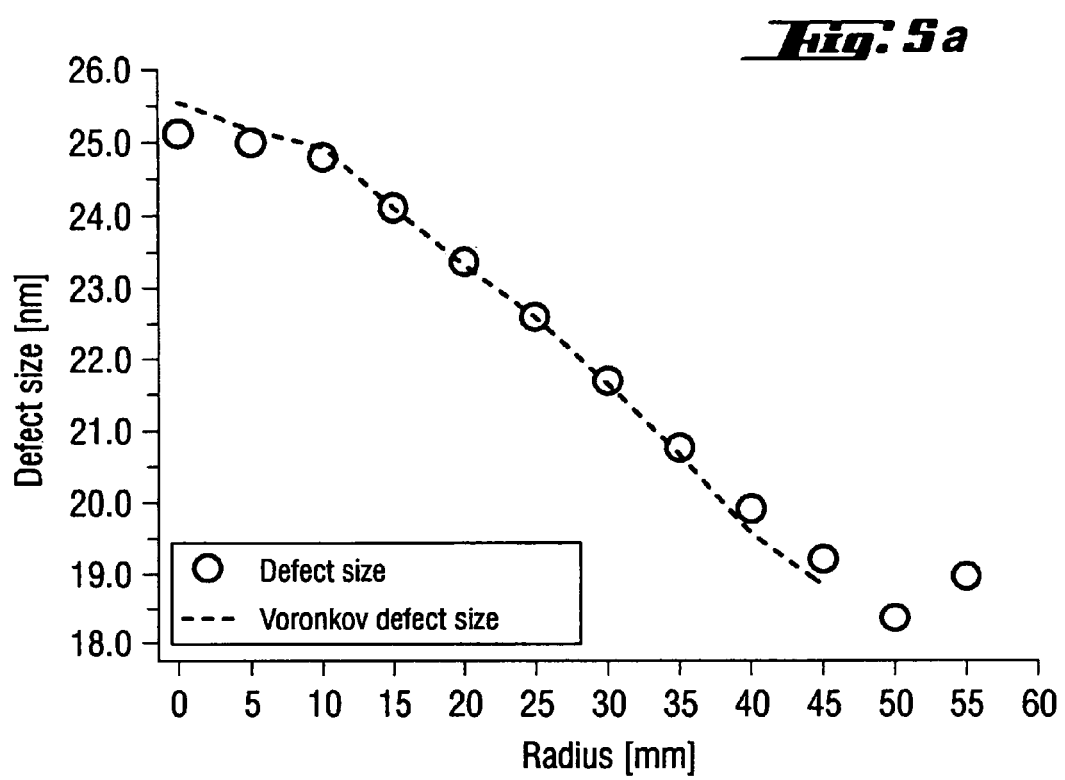

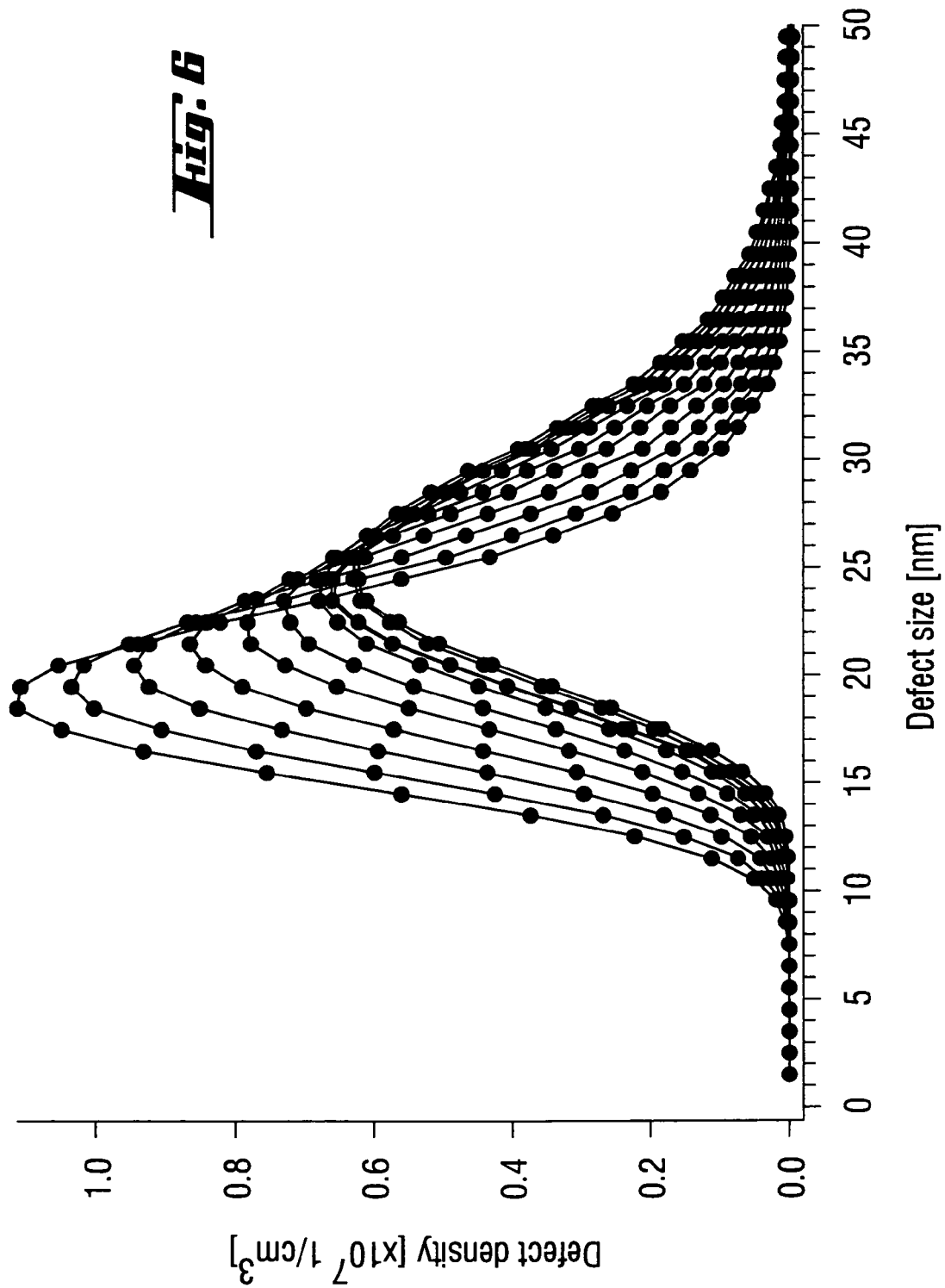

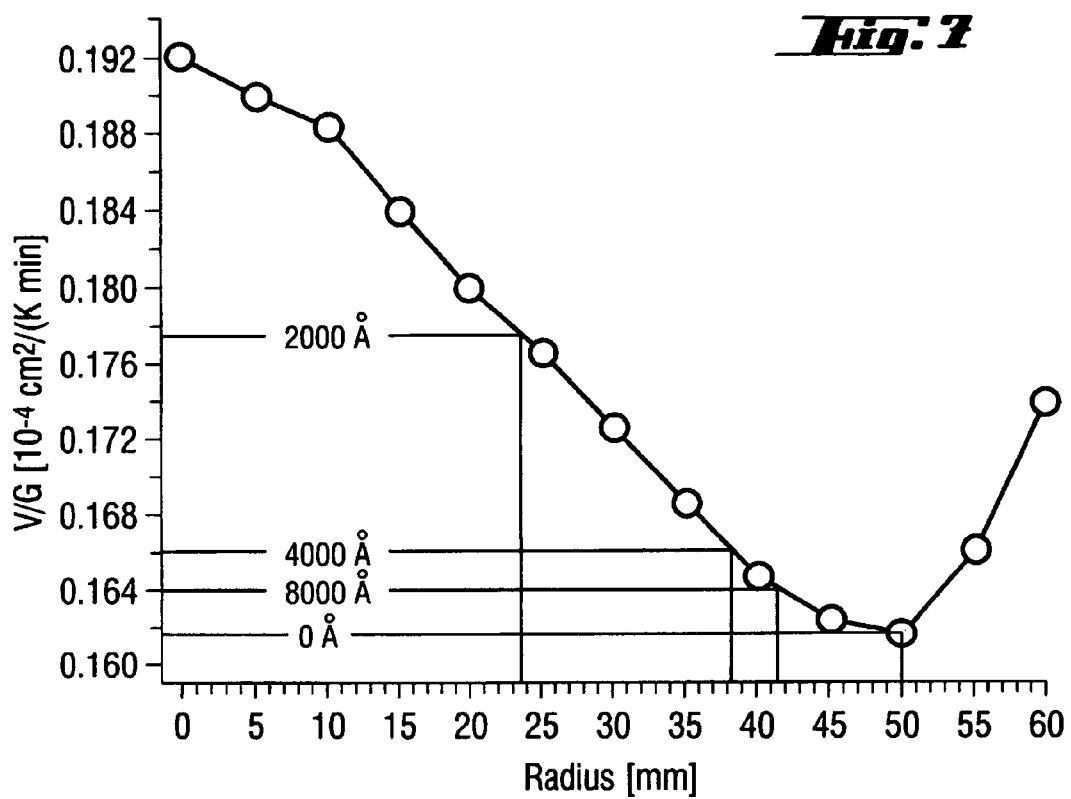

PROCESS FOR PRODUCING SILICON SEMICONDUCTOR WAFERS WITH DEFINED DEFECT PROPERTIES, AND SILICON SEMICONDUCTOR WAFERS HAVING THESE DEFECT PROPERTIES

BACKGROUND OF THE INVENTION

1. Field of the Invention

The invention relates to a process for producing silicon semiconductor wafers with defined defect properties in terms of agglomerated vacancy defects. The invention also relates to silicon semiconductor wafers having these defect properties.

2. Background Art

It is known that single-crystal silicon may have grown-in defects, which are undesirable since they interfere with the functioning of electronic components which are integrated in the silicon, and may even cause functional failure of such devices. Defects of this type are in particular agglomerates of point defects, a distinction being drawn in this context between vacancies and silicon interstitials. If point defects of this type reach supersaturated levels, they tend to collect to form agglomerates. Agglomerated vacancy defects (voids) are often referred to in the literature as COP defects (crystal originated particles), LPDs (light point defects), LLS (localized light scatterers), LSTD (laser scanning tomography defects) or FPD (flow pattern defects). Silicon interstitials are referred to as "A defects" (A-swirl-defects) or Lpit's (large etch pits), if the agglomerates, on account of their size, are already forming secondary defects in the form of dislocations, and "B defects" if secondary defects of this type have not yet occurred.

It is also known that the point defects are formed during the production of the single crystal, and in this context the ratio V/G of the pulling rate V and the axial temperature gradient G at the growth front of the crystal are the defining parameters. If the ratio V/G is above a critical value $\xi c$, which nowadays is currently assumed to be approximately $0.134 \text{ mm}^2\text{min}^{-1}\text{K}^{-1}$, point defects of the vacancy type dominate, whereas at a ratio V/G below the critical value $\xi c$, silicon interstitials dominate. During cooling of the single crystal, the point defects which have formed reach supersaturated levels and can accumulate to form larger groupings. It is known that the size of the agglomerated vacancy defects is influenced to a crucial extent by the cooling rate q at which the single crystal is cooled from approximately 1100° C. to lower temperatures, specifically in such a manner that the defect size decreases with increasing cooling rate, whereas the density of these defects rises. Since the cooling rate q is approximately directly proportional to the axial temperature gradient G, it is therefore also possible to influence the size of the agglomerated point defects by suitably controlling the ratio V/G during pulling of the single crystal, and if the axial temperature gradient G is known, it is possible to draw conclusions as to the size of the agglomerated vacancy defects which form. Agglomerated vacancy defects are generally octahedral in form. Details on the size of defects of this type describe a volume of a sphere corresponding to the defect volume.

The radiant heat emitted from the edge of the single crystal causes the axial temperature gradient G to rise toward the edge of the single crystal. A direct consequence of this radial dependency of the axial temperature gradient G(r) on the radial position r of the single crystal and of the abovementioned dependency of the size of the agglomerated vacancy defects on the axial temperature gradient G is that the size of these defects is not constant in the vacancy zone of a semiconductor wafer, but rather decreases from the center toward the edge of the semiconductor wafer, whereas the density of the defects increases in the same direction.

The axial temperature gradient G can be calculated accurately using computer codes (for example FEMAG from FEMAGSoft S.A., Belgium), which means that it is possible to control the ratio V/G by controlling the pulling rate. At the same time, given knowledge of the axial temperature gradient G, the radial distribution of the incorporated vacancies and therefore in turn the radial variation in the mean size of the agglomerated vacancy defects can be calculated. Formulae which were developed by Voronkov (Voronkov, V. V. and Falster, R. (1999) J. APPL. PHYS., 86, (11) 5975 and Voronkov, V. V. and Falster, R. (1998) J. CRYSTAL GROWTH, 194 76) form the theoretical basis for these calculations. These formulae allow, for example, experimentally verifiable predictions to be made as to the concentration of incorporated vacancies, the concentration of agglomerated vacancies and the size of these agglomerates.

The presence of agglomerated vacancy defects start to become a problem, given an increasing integration density of electronic components and the associated reduction in size of the structures used to form them, if the size of these defects is in the region of the feature size of the components.

To solve this problem, it has already been proposed that the ratio V/G be controlled in such a manner that no agglomerated point defects are formed, since the supersaturation of the point defects which this requires is not reached. However, control of this type, in particular when producing silicon semiconductor wafers with large diameters of 200 mm and above, can only be realized with considerable difficulties, since on account of the dependency of the axial temperature gradient G on the radial position r, only a narrow process window within which V/G may vary is available. As demonstrated by an accurate calculation based on the Voronkov formulae, the V/G range in which there is no agglomeration of vacancies in the vacancy-rich zones is extremely narrow and therefore not technically accessible. Similar considerations apply to the B defects on the Si interstitial-rich side. Only the formation of Lpit's can be avoided by a greater V/G range, since for this purpose a critical size of the interstitial aggregates has to be exceeded.

Another way of solving the problem consists in dissolving agglomerated vacancy defects by means of a heat treatment of the semiconductor wafers in a region close to the surface. A heat treatment of this type is likewise complex and, in particular if it is carried out in an oxidizing atmosphere, cannot be fully realized (Ji Wook Seo and Young Kwan Kim, JOURNAL OF THE ELECTROCHEMICAL SOCIETY, 149 (7) G379-G383 (2002)). According to current opinion as expressed in the prior art, a two-stage mechanism is active during the heat treatment; in the first stage, an oxide layer is removed from the inner surface of the agglomerated vacancy defects. This requires the oxygen to diffuse out of the region close to the surface, thereby eliminating the oxygen supersaturation which is present there. Only after that can the agglomerated vacancy defects be dissolved by recombination with silicon interstitials and by outdiffusion of vacancies. Although the production of a thermal oxide layer on the semiconductor wafer promotes the formation of silicon interstitials, an oxidizing heat treatment of the semiconductor wafers aimed at achieving this is considered unfavorable compared to a heat treatment in a nonoxidizing atmosphere, such as argon, since it impedes the elimination of the oxide layer from the inner surface of the agglomerated vacancy defects which is required in the first step.

SUMMARY OF THE INVENTION

It is an object of the present invention to provide a way of avoiding the need to eliminate agglomerated vacancy defects, with the difficulties associated therewith, yet nevertheless ensure that the presence of this type of defect does not compromise the functionality of electronic components processed from the semiconductor wafer in subsequent process steps. These and other objects are achieved by crystal growth under conditions such that the ratio V/G and axial temperature gradient G at the growth front are controlled such that agglomerated vacancy defects above a critical size, but which shrink during component manufacture, are formed.

BRIEF DESCRIPTION OF THE DRAWINGS

FIG. 5a correlates mean defect size with values predicted by the Voronkov formulae;

FIG. 6 illustrates the defect density plotted against defect size of a test wafer; and FIG. 7 illustrates the radial V/G relationship which can be used to regulate defect size.

DETAILED DESCRIPTION OF THE PREFERRED EMBODIMENT(S)

Figure 1:
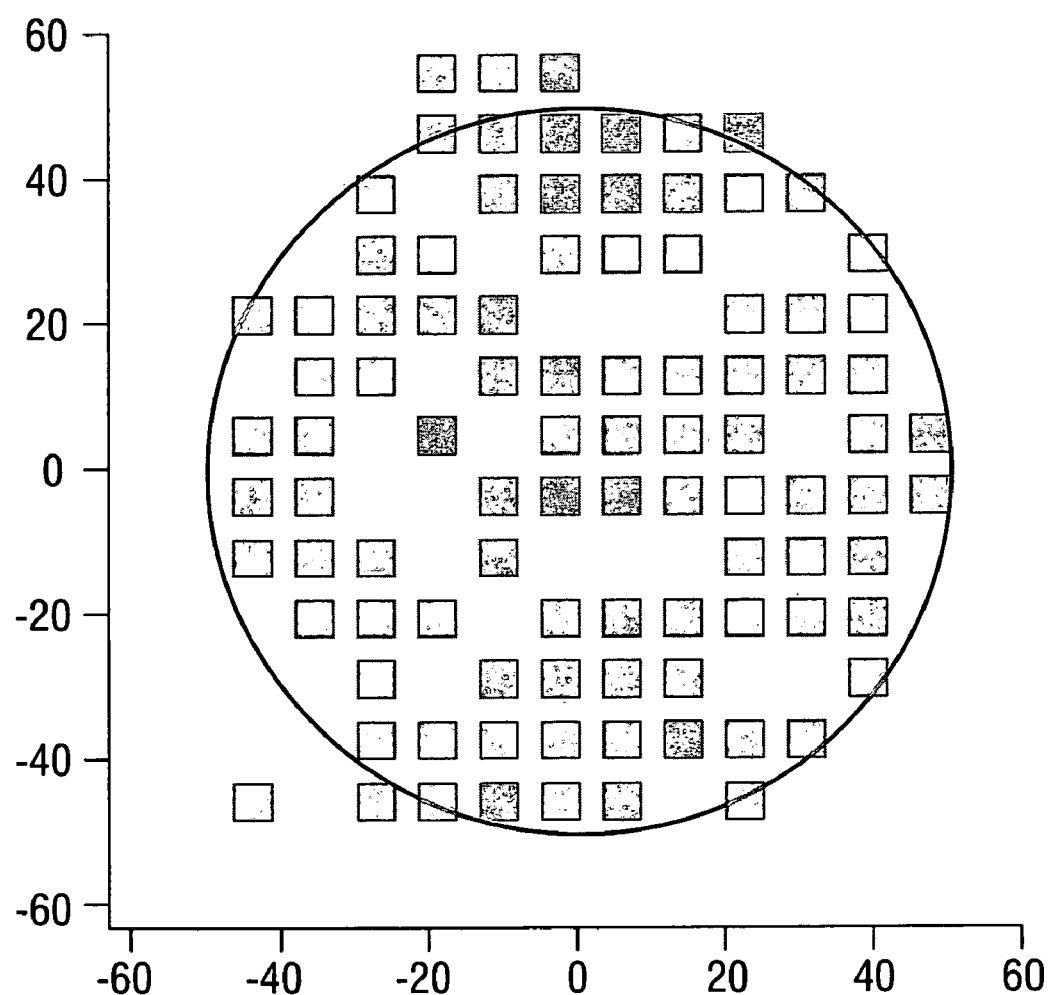
FIG. 1 illustrates the results of GOI measurement of capacitors formed in a wafer not subject to sacrificial oxidation.

The invention thus relates to a process for producing silicon semiconductor wafers, in which a silicon single crystal is pulled using the Czochralski method and is processed to form semiconductor wafers, a ratio V/G of pulling rate V and axial temperature gradient G at a growth front during the pulling of the single crystal being controlled in such a manner that agglomerated vacancy defects of a size above a critical size are formed in the single crystal, the agglomerated vacancy defects, in a region of the semiconductor wafer that is of relevance to electronic components, shrinking during production of the components, in such a manner that the size in this region no longer exceeds the critical size.

The invention also relates to a silicon semiconductor wafer with agglomerated vacancy defects in a region that is of relevance to electronic components, the agglomerated vacancy defects having an inner surface which is at least partially free of an oxide layer and a size of less than 50 nm.

The invention is based on the discovery that agglomerated vacancy defects can only have adverse effects on electronic components above a critical size, and that the size of these defects decreases the fabrication of electronic components, provided that a continuous inner oxide layer has not yet formed. The fabrication of electronic components generally involves heat treatments in which silicon interstitials are formed, which can have the effect of reducing the size of the agglomerated vacancy defects. Heat treatments having this effect are in particular oxidizing heat treatments, for example those in which a gate oxide is produced.

Although, given a sufficiently high temperature of the heat treatment, agglomerated vacancy defects are dissolved even in the absence of an oxidizing atmosphere if their radius is smaller than the radius specific to this temperature, up to which these defects are thermodynamically stable, this fact is of relatively little significance, in particular for future advances, since electronic components are being fabricated at even lower temperatures.

Although semiconductor wafers produced in accordance with the invention do have agglomerated vacancy defects, these are only such that, based on their small size, they are not detrimental to the functionality of the components, taking into account the fact that the size of the agglomerated vacancy defects also decreases during fabrication of the electronic components. Such a decrease in the defect size was not to be expected according to the abovementioned prior art, since the elimination of the inner oxide layer, which was deemed to be a precondition for this, is inhibited by the formation of silicon interstitials and by the lack of outdiffusion of oxygen.

Without wishing to be bound by theory, it is assumed that the process according to the invention involves agglomerated vacancy defects which, on account of their size, have an inner surface which is not (completely) covered with an oxide layer. A surface of this type is exposed to two competing reactions. Silicon interstitials can accumulate, with the agglomerated vacancy defects shrinking. It is also possible for oxygen to diffuse out of the single crystal to the inner surface of the agglomerated vacancy defects, with the result that the inner oxide layer grows. As soon as the oxide layer covers the inner surface of the agglomerated vacancy defects, the competing accumulation of silicon interstitials is no longer possible. This assumption concurs with experimental results achieved by the inventors, according to which, during the reduction of the size of agglomerated vacancy defects by an oxidizing heat treatment, also referred to below as sacrificial oxidation, success decreases with increasing depth. The thermal oxide layer formed at the surface of the semiconductor wafer, which is also referred to below as a sacrificial oxide layer, injects silicon interstitials into the regions of the semiconductor wafer lying below. The silicon interstitials either do not reach agglomerated vacancy defects which, compared to the surface of the semiconductor wafer, are located deeper in the crystal since they accumulate at agglomerated vacancy defects located closer to the surface of the semiconductor wafer, or only reach these agglomerated vacancy defects at a time at which the competing formation of an inner oxide layer already prevents further accumulation of silicon interstitials. An oxidizing heat treatment therefore means that agglomerated vacancy defects are less likely to shrink the deeper they are located in the crystal, i.e. the further away from the surface of the semiconductor wafer. According to the invention, this result is taken into account by the requirement that the size of the agglomerated vacancies must not exceed the critical size after the fabrication of electronic components at any point in the semiconductor wafer at which electronic components are provided, i.e. in the region that is of relevance to electronic components.

For the sake of completeness, it should also be noted that other heat treatments, such as for example phosphorus diffusion, produce silicon interstitials and therefore have a similar effect to an oxidizing heat treatment. However, such treatments are generally less suitable, since they inevitably alter the dopant profile or have other drawbacks. For this reason, the text which follows only describes one preferred embodiment of the invention.

The invention allows the process for producing semiconductor wafers to be adapted to requirements which must be satisfied for reliable functioning of electronic components which the semiconductor wafers are subsequently processed to form, and which generally vary. It avoids any outlay which is not required to meet these requirements.

To determine whether a silicon semiconductor wafer which has agglomerated vacancy defects is fundamentally suitable as a substrate for the fabrication of electronic components, it is recommended to use a GOI (Gate Oxide Integrity) measurement. This highly sensitive method involves producing MOS capacitors on the wafer surface and evaluating the electrical breakdown field strength using current-voltage measurements. A description of the preparation and measurement method is to be found in K. Yamabe, K. Taniguchi, and Y. Matsushita, in Proc. Of the Internat. Reliability Phys. Symp., p. 184, IEEE, NJ (1983). A poor breakdown strength is a reliable indicator of the presence of disruptive agglomerated vacancy defects. Conversely, if the breakdown strength is in the region of 100%, it can be assumed that the semiconductor wafer is suitable for the fabrication of electronic components.

According to the preferred embodiment of the invention, it is provided in a first step that a test wafer be provided, having a center region and an edge region and agglomerated vacancy defects of a defined size, with the size of the agglomerated vacancy defects decreasing from the center region toward the edge region of the test wafer. A test wafer of this type can be obtained both from a single crystal produced by the Czochralski method (CZ method) and from a single crystal produced by the float zone process (FZ process); during the production of this single crystal, the ratio V/G is selected in such a manner that in the center of the crystal it is above the critical value $\xi c$. The single crystal produced by the FZ process should expediently be doped with oxygen to a comparable extent to a single crystal produced by the CZ method. On account of the radial dependency of the axial temperature gradient G, the size of the vacancy defects decreases continuously from the center region to the edge region. The agglomerated vacancy defects can be assigned a specific size as a function of their radial position r.

In the next step, the test wafer is subjected to at least one oxidizing heat treatment (sacrificial oxidation), during which an oxide layer (sacrificial oxide layer) of a defined thickness, preferably from 1 to 2000 nm, is formed on the wafer surface. The step is intended to approximately simulate a process for fabricating electronic components, in terms of the application of heat and the generation of silicon interstitials, to which the semiconductor wafers that are to be produced by the present invention are subjected during component fabrication.

Then, the sacrificial oxide layer is removed and a GOI measurement is carried out. This measurement makes it clear from what radial position r the breakdown strength of the MOS capacitors just still meet requirements. Where the required breakdown strength is not achieved, it is assumed that there are agglomerated vacancy defects of a size above the size referred to as critical.

During the subsequent production of the single crystal, it should be ensured that the single crystal is pulled under conditions in which the ratio V/G corresponds to a value at which agglomerated vacancy defects of a size exceeding the critical size following shrinkage which takes place during the fabrication of electronic components (component process) are just no longer formed. If semiconductor wafers obtained from the single crystal produced in this way were to be subjected to a GOI measurement, these semiconductor wafers would appear unsuitable. However, since they undergo a heat treatment, as simulated by the oxidizing heat treatment of the test wafer, during the component process, the agglomerated vacancy defects shrink to a critical size which is below that which is harmful to the components.

The abovementioned depth dependency of the effect of the heat treatment on the size of agglomerated vacancy defects can be demonstrated on the basis of the thickness of the sacrificial oxide layer which is formed during the oxidizing heat treatment of the test wafer. The thickness of this sacrificial oxide layer is approximately double that of the silicon consumed by the oxidation. If the oxide layer formed during the GOI measurement is disregarded, the result is that the critical size which is found can be set as a limit size, provided that there are no component structures which are to lie at a greater depth in the semiconductor wafer than the thickness of the silicon consumed during the sacrificial oxidation. Otherwise, the thickness of the sacrificial oxide layer needs to be increased accordingly during the oxidizing heat treatment of the test wafer, in order to provide experience about the critical defect size which is pertinent to deeper regions.

The invention was tested on silicon semiconductor wafers with a diameter of 125 mm which were produced by the FZ process with a pulling rate of 2.5 mm/min and, which were, in the process, doped with oxygen. The oxygen concentration was $5 \cdot 10^{17}$ atoms/cm$^3$ and was therefore in a range within which the oxygen concentration of material pulled by the Czochralski method typically also lies. Furthermore, the pulling conditions (V/G(r)) during the pulling of the single crystal were selected in such a way that agglomerated vacancy defects were formed in a zone from the center of the crystal to at least a radius of 0.8 R (R=crystal radius). This was confirmed by GOI measurements carried out on semiconductor wafers which were obtained from the oxygen-doped single crystal. Further test wafers produced from this single crystal were subjected to a sacrificial oxidation (T=1110° C.). The duration was varied so that different oxide thicknesses (200, 400 and 800 nm) were formed. The oxide (sacrificial oxide) was then removed and a GOI measurement, during which an oxide layer with a thickness of 25 nm is formed again, was carried out.

The result of these measurements is illustrated in FIGS. 1 to 4.

FIG. 1 shows the results of a GOI measurement carried out on a test wafer which had not been subjected to any sacrificial oxidation. The illustration in graph form emphasizes the test capacitors which had broken down under an applied field strength of less than 9 MV/cm. The shades of gray indicate the actual breakdown field strengths. The test capacitors which broke down are predominantly located in a circle with the radius indicated.

Figure 2:
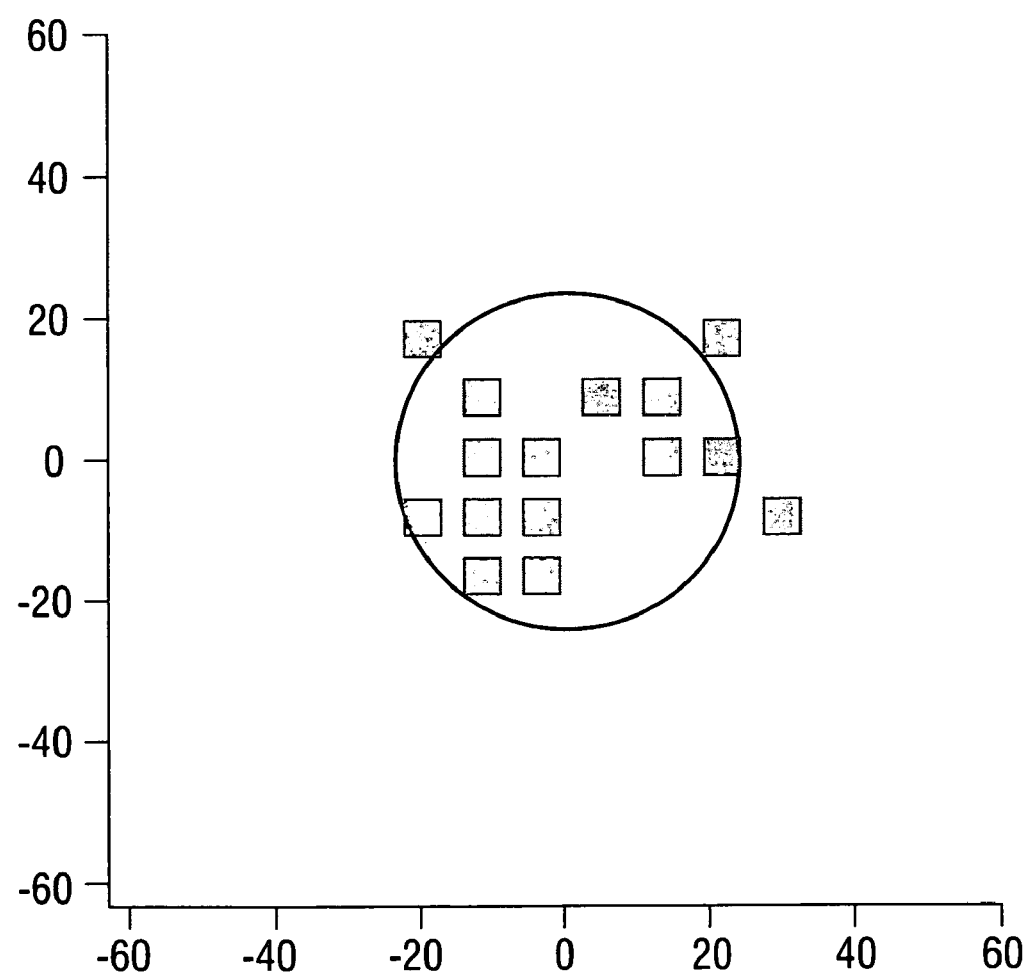
FIGS. 2-4 illustrate GOI measurements as in FIG. 1, but with sacrificial oxide layers of 200 nm, 400 nm, and 800 nm thickness, respectively.
Figure 3:
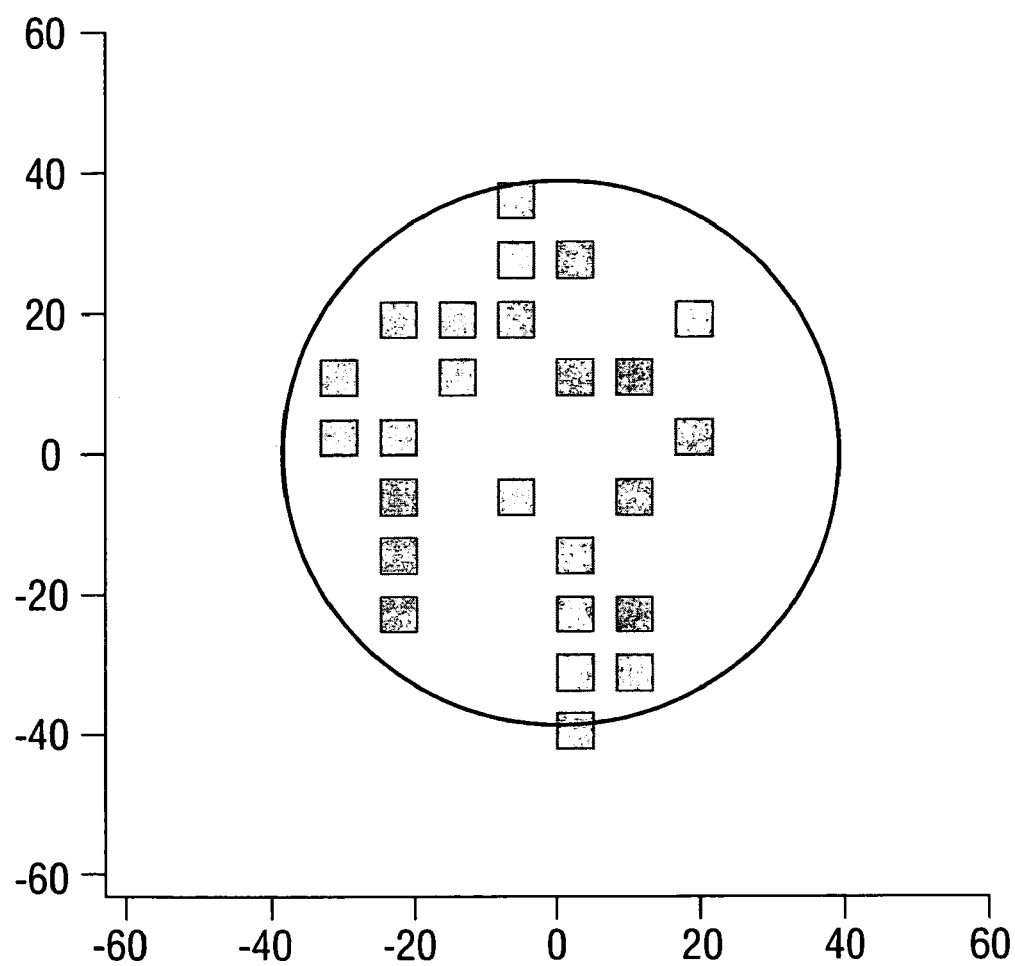
Figure 4:
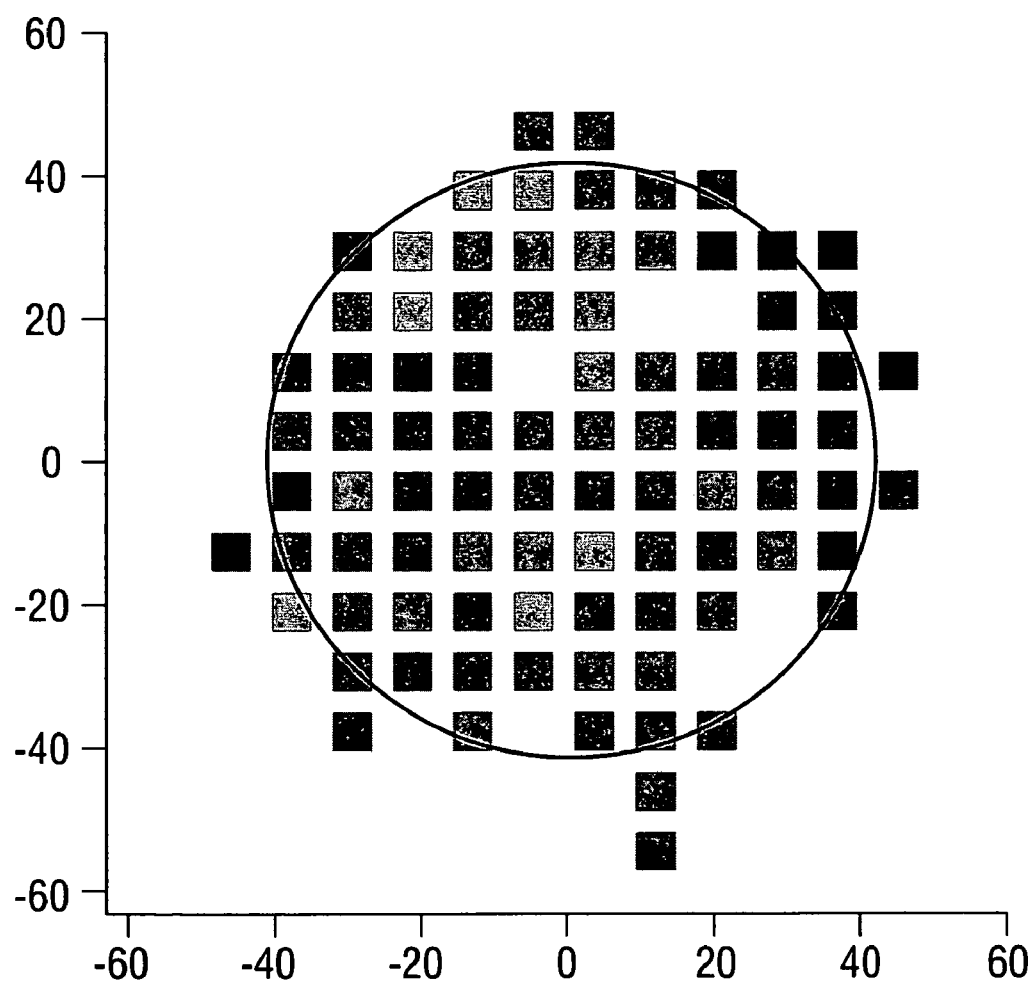

FIGS. 2, 3 and 4 show the results of similar GOI measurements on test wafers which have been subjected to a prior sacrificial oxidation, producing oxide layers with the thicknesses indicated.

It can be seen that the radius of the zone of detectable agglomerated vacancies was much smaller at a sacrificial oxide thickness of 200 nm. However, this effect decreased again with increasing thickness of the sacrificial oxide. At a thickness of 800 nm there was scarcely any perceptible difference compared to the test wafer on which only the GOI measurement but no oxidizing heat treatment had been carried out.

These results confirm the assumption expressed above that agglomerated vacancy defects, beyond a certain size, can be made to shrink by a sacrificial oxidation to such an extent that they no longer have any adverse effects on the breakdown properties of the capacitors. It is also confirmed that this size, based on the wafer surface, is depth-dependent, i.e. increases at increasing distance from the wafer surface.

Figure 5:
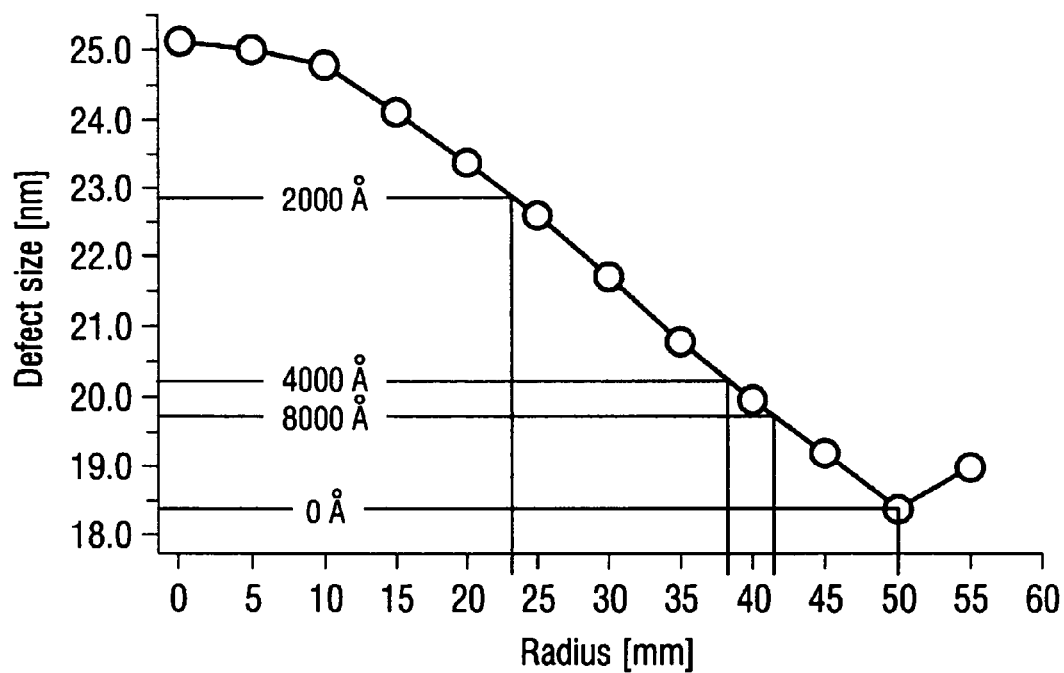
FIG. 5 illustrates the radial distribution of agglomerated vacancy defects on a test wafer.

A size distribution of the agglomerated vacancy defects can be calculated for every radial position on the test wafer. FIG. 5 shows the way in which the mean defect size (defect diameter) is dependent on the radial position. The radial positions and the corresponding defect sizes at which, in accordance with the results illustrated in FIGS. 1 to 4, the breakdown strength of the test capacitors was just still sufficient are additionally plotted. The corresponding defect sizes correspond to the respective critical size. Since the formation of a sacrificial oxide layer with a thickness of 200 nm consumes silicon down to a depth of approximately 100 nm, the oxide layer thicknesses should be halved to give the depth of the region which is suitable for the fabrication of electronic components, because the agglomerated vacancy defects do not exceed the critical size in this region.

The experimental results above, with the aid of the calculated radial dependency of the defect sizes (defect diameters) (FIG. 5), gave a critical size of approx. 23 nm, based on a depth of 100 nm, or of approx. 20 nm, based on a depth of 200 nm. The defect sizes indicated in FIG. 5 represent the respective mean value of the size distribution shown in FIG. 6 at any radial position of the test wafer. The maximum of the distribution in FIG. 6 corresponds to the defect size shown in FIG. 5. The defect sizes in FIG. 5 and their distributions in FIG. 6 were obtained from simulation calculations. The respective mean sizes correspond very well to the values which are given by the Voronkov formulae (FIG. 5a) if the radial V/G variation is known (FIG. 7). The proportionality factor in the Voronkov formula defect diameter $(cm) = \epsilon \cdot (Cv/q)^{1/2}$ is $3.6 \cdot 10^{-12}$ $cm^{5/2} K^{1/2}$ $min^{-1/2}$. The critical sizes determined in this way can then each be assigned a defined V/G value with in terms of this defect size must not be exceeded at any point in the growing crystal during the pulling of the crystal, with the aid of the radial V/G variation calculated in FIG. 7. According to a formula which the inventors have derived from Voronkov's work, the relationship $(V/G - \xi c) \sim D^2 \cdot V^2$ applies to the V/G process window or, because pulling is taking place in the vicinity of $V/G = \xi c$, $(V/G - \xi c) \sim D^2 \cdot G^2$, where D is the critical defect diameter, applies to the V/G process window. Since all the variables are known from the simulation calculations, it is possible to determine the proportionality constant $\alpha$. It is $0.56 \cdot 10^8 \pm 10\%$ $mm^2 min^{-1} K^{-3}$, based on the second formula with the $G^2$ dependency. This means that if D is predetermined by the component process and G by the pulling process selected, the crystal must be pulled in such a way that the following relationship applies at every radial position of the crystal, for a given G: $(V/G - \xi c) \leq \alpha \cdot D^2 \cdot G^2$. The value in the center of the crystal is preferably selected for G, since G generally adopts the lowest value there and it is therefore at that location that the critical defect diameter D tends to be exceeded first of all. It follows from the formula that the permissible process window rises proportionally to the power of 2 to the axial temperature gradient G or the pulling rate V and the critical defect diameter D. It is preferable for the ratio V/G to be controlled in such a manner that the following relationship applies: $V/G = \xi c$. It is also preferable for the ratio V/G to be controlled in such a manner that no Lpit's are formed.

For many component processes of the most modern generation, the critical value D is currently in the range from 20-50 nm. This is much smaller than the size range accessible to the standard detection of FPD defects by means of a Secco etch. A critical size of 18 nm was determined for semiconductor wafers produced by the FZ process without oxygen doping and tested without sacrificial oxidation, i.e. without thermal process steps the critical size is <20 nm. This value corresponds to the critical size obtained for the untreated, oxygen-doped FZ wafer from FIG. 1 (cf. FIGS. 1 and 5). This is a clear indication that the defects with a critical size contained in the wafer from FIG. 1, despite the oxygen doping, do not have an oxide layer.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing silicon semiconductor wafers, comprising:

pulling a silicon single crystal using the Czochralski method and processing to form semiconductor wafers, a ratio V/G of pulling rate V and axial temperature gradient G at a growth front during the pulling of the single crystal being controlled to produce agglomerated vacancy defects above a critical size in the single crystal, the agglomerated vacancy defects, in a region of the semiconductor wafer that is of relevance to electronic components, the agglomerated vacancy defects exhibiting shrinkage during production of the components, such that the size of the agglomerated vacancy defect in this region no longer exceeds the critical size, wherein the ratio V/G is controlled such that the following formula is satisfied for G at every radial position of the single crystal:

$(V/G - \xi c) \leq \alpha \cdot D^2 \cdot G^2$, where $\alpha$ is a proportionality constant having the value $0.56 \cdot 10^8 \pm 10\%$ $mm^2$ $min^{-1} K^{-3}$, D is the critical size and $\xi c$ is the critical value at which no type of point defect is dominant.

2. The process of claim 1, further comprising determining the critical size with the aid of a test wafer which is subjected to a treatment which simulates the production of the components in terms of the application of heat and generation of silicon interstitials.

3. The process of claim 2, wherein an oxide layer with a thickness of from 1 to 2000 nm is produced on the test wafer.

4. The process of claim 2, wherein phosphorus is made to diffuse into the test wafer.

5. The process of claim 1, wherein the ratio V/G is controlled in such a manner that the following relationship applies:

$V/G = \xi c$.

6. The process of claim 1, wherein the ratio V/G is controlled in such a manner that no Lpit's are formed.

7. A method for producing silicon semiconductor wafers, comprising pulling a silicon single crystal by the Czochralski method, said pulling process predetermining an axial temperature gradient G at a growth front; determining a critical size D of shrinkable agglomerated vacancy defects by subjecting a test wafer having agglomerated vacancy defects to at least one heat treatment which simulates a heat treatment during an electronic device forming process injecting silicon interstitials into the wafer;

pulling a silicon single crystal with said pulling process; and controlling a ratio V/G of pulling rate V and said axial temperature gradient G during the pulling of the single crystal so that the following formula is satisfied for G at every radial position of the single crystal: $(V/G - \xi c) \leq \alpha \cdot D^2 \cdot G^2$, where $\alpha$ is a proportionality constant having the value $0.56 \cdot 10^6 \pm 10\%$ mm$^2$min$^{-1}$K$^{-3}$ and $\xi c$ is the critical value at which no type of point defect is dominant; producing wafers from the silicon single crystal.

8. The process of claim 7, wherein an oxide layer with a thickness of from 1 to 2000 nm is produced on the test wafer.

9. The process of claim 7, wherein phosphorus is made to diffuse into the test wafer.

10. The process of claim 7, wherein the ratio V/G is controlled in such a manner that the following relationship applies: $V/G \geq \xi_c$.

11. The process of claim 7, wherein the ratio V/G is controlled in such a manner that no Lpit's are formed.

12. The process of claim 7, further comprising fabricating electronic devices on the silicon wafer by performing an electronic device fabrication process to produce said electronic devices on said wafer, agglomerated vacancy defects shrinking during said device fabrication process to a size which does not affect device performance.

13. The process of claim 12, wherein prior to device fabrication, the wafer has agglomerated vacancy defects of a size which will affect device performance.

* * * * *